(12) United States Patent
Lu

(10) Patent No.: US 7,995,980 B2
(45) Date of Patent: Aug. 9, 2011

(54) AUTOMATIC GAIN CONTROL APPARATUS AND METHOD

(75) Inventor: Shih-Chuan Lu, Tainan County (TW)

(73) Assignee: Himax Media Solutions, Inc., Fonghua Village, Xinshi Dist., Tainan (TW)

( * ) Notice: Subject to any disclaimer, the term of this patent is extended or adjusted under 35 U.S.C. 154(b) by 372 days.

(21) Appl. No.: 12/420,059

(22) Filed: Apr. 8, 2009

(65) Prior Publication Data

US 2010/0261447 A1    Oct. 14, 2010

(51) Int. Cl.
*H04B 1/06* (2006.01)
*H04B 7/00* (2006.01)
(52) U.S. Cl. .................................. 455/234.1; 455/245.1
(58) Field of Classification Search ................ 455/232.1, 455/245.1, 245.2
See application file for complete search history.

(56) References Cited

U.S. PATENT DOCUMENTS

| | | | | |
|---|---|---|---|---|
| 4,910,797 A | * | 3/1990 | Min et al. ..................... | 455/249.1 |
| 5,051,707 A | * | 9/1991 | Fujita ........................... | 330/279 |
| 5,117,201 A | * | 5/1992 | Luther .......................... | 330/279 |
| 5,955,925 A | * | 9/1999 | Segawa et al. ................ | 330/279 |
| 6,771,719 B1 | * | 8/2004 | Koyama et al. ............... | 375/345 |
| 6,862,327 B2 | * | 3/2005 | Van Sinderen ................ | 375/345 |
| 7,277,510 B1 | * | 10/2007 | Kilani et al. .................. | 375/345 |
| 7,292,649 B2 | * | 11/2007 | Atkinson et al. .............. | 375/316 |
| 7,321,394 B1 | * | 1/2008 | Grodevant ..................... | 348/370 |
| 7,456,690 B2 | * | 11/2008 | Kocaman et al. ............. | 330/279 |
| 7,515,891 B2 | * | 4/2009 | Darabi ........................ | 455/250.1 |
| 7,589,657 B2 | * | 9/2009 | Tan et al. ...................... | 341/155 |
| 7,933,369 B2 | * | 4/2011 | Choi et al. .................... | 375/345 |

\* cited by examiner

*Primary Examiner* — Thomas J Hiltunen
(74) *Attorney, Agent, or Firm* — Winston Hsu; Scott Margo

(57) ABSTRACT

An automatic gain control apparatus includes a first comparing module, a counting module, a second comparing module, and a control module. The first comparing module compares an input signal with a first threshold level and a second threshold level to generate a first compared output signal and a second compared output signal respectively. The counting module performs counting operations upon the first compared output signal and the second compared output signal to generate a first counting number and a second counting number respectively. The second comparing module compares the first counting number with a first threshold number to generate a first detection signal and compares the second counting number with a second threshold number to generate a second detection signal. The control module controls the gain of a radio frequency amplifier or an intermediate frequency amplifier according to the first detection signal and the second detection signal.

13 Claims, 6 Drawing Sheets

AUTOMATIC GAIN CONTROL APPARATUS AND METHOD

BACKGROUND OF THE INVENTION

1. Field of the Invention

The present invention relates to an automatic gain control apparatus and the related gain control method, and more particularly to a low cost automatic gain control apparatus.

2. Description of the Prior Art

Please refer to FIG. 1. FIG. 1 is a diagram illustrating a conventional radio signal receiving module 100, such as a digital television receiver. The radio signal receiving module 100 comprises an antenna 102, a radio frequency amplifier 104, a mixer 106, a SAW (Surface Acoustic Wave) filter 108, an intermediate frequency amplifier 110, an ADC (Analog-to-digital converter) 112, and a AGC (Automatic gain control) apparatus 114. The radio signal receiving module 100 is utilized to receive a radio signal Sr and output a corresponding digital signal Sd to a demodulator 116. The AGC apparatus 114 is utilized for detecting a power of the digital signal Sd and for adjusting a gain of the radio frequency amplifier 104 and the intermediate frequency amplifier 110. Since the configuration of the radio signal receiving module 100 is a feedback control configuration, the stability issue can be a critical problem of the radio signal receiving module 100. In other words, the radio signal receiving module 100 should not be influenced by the channel noise. In addition, the co-operation between the radio frequency amplifier 104 and the intermediate frequency amplifier 110 should be inter-influenced to further stabilize the radio signal receiving module 100. When the power of the radio signal Sr is varied, the AGC apparatus 114 adjusts the gain of the radio frequency amplifier 104 in order to keep the output of the radio frequency amplifier 104 falling within an appropriate range, as well as the intermediate frequency amplifier 110. Therefore, the reaction time of the AGC apparatus 114 to adjust the gains of the radio frequency amplifier 104 and the intermediate frequency amplifier 110 is another critical problem of the radio signal receiving module 100. Meanwhile, the cost, i.e., the device size, of the radio signal receiving module 100 is also a main consideration in designing the radio signal receiving module 100.

Conventionally, the AGC apparatus 114 of the radio signal receiving module 100 adjusts the gain of the radio frequency amplifier 104 and the intermediate frequency amplifier 110 by a digital signal power detector, such as a peak detector, which may occupy a large area. Furthermore, the AGC apparatus 114 may have a non-obvious take-over-point (TOP) to result in destabilizing the radio signal receiving module 100. In other words, the AGC apparatus 114 may adjust both the radio frequency amplifier 104 and the intermediate frequency amplifier 110 at the same time due to the non-obvious take-over-point (TOP), which may destabilize the radio signal receiving module 100. Therefore, providing a low cost and efficient take-over-point (TOP) AGC apparatus for a radio signal receiving module is a significant concern in the digital television industry field.

SUMMARY OF THE INVENTION

One of the objectives of the present invention is to provide a low cost gain control circuit and the related gain control method.

According to an embodiment of the present invention, an automatic gain control (AGC) apparatus for controlling a radio frequency amplifier and an intermediate frequency amplifier is disclosed. The gain control apparatus comprises a first comparing module, a counting module, a second comparing module, and a control module. The first comparing module compares an input signal with a first threshold level and a second threshold level to generate a first compared output signal and a second compared output signal respectively. The counting module is coupled to the first comparing module for performing a first counting operation upon the first compared output signal to generate a first counting number, and performing a second counting operation upon the second compared output signal to generate a second counting number. The second comparing module is coupled to the counting module for comparing the first counting number with a first threshold number to generate a first detection signal, and comparing the second counting number with a second threshold number to generate a second detection signal. The control module is coupled to the second comparing module, the radio frequency amplifier and intermediate frequency amplifier for selectively controlling the gain of the radio frequency amplifier or intermediate frequency amplifier according to the first detection signal and the second detection signal.

According to a second embodiment of the present invention, a gain control method for controlling a radio frequency amplifier and an intermediate frequency amplifier. The gain control method comprises the following steps: comparing an input signal with a first threshold level and a second threshold level to generate a first compared output signal and a second compared output signal respectively; performing a first counting operation upon the first compared output signal to generate a first counting number and a second counting operation upon the second compared output signal to generate a second counting number; comparing the first counting number with a first threshold number to generate a first detection signal and the second counting number with a second threshold number to generate a second detection signal; and controlling the gain of the radio frequency amplifier or the intermediate frequency amplifier according to the first detection signal and the second detection signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
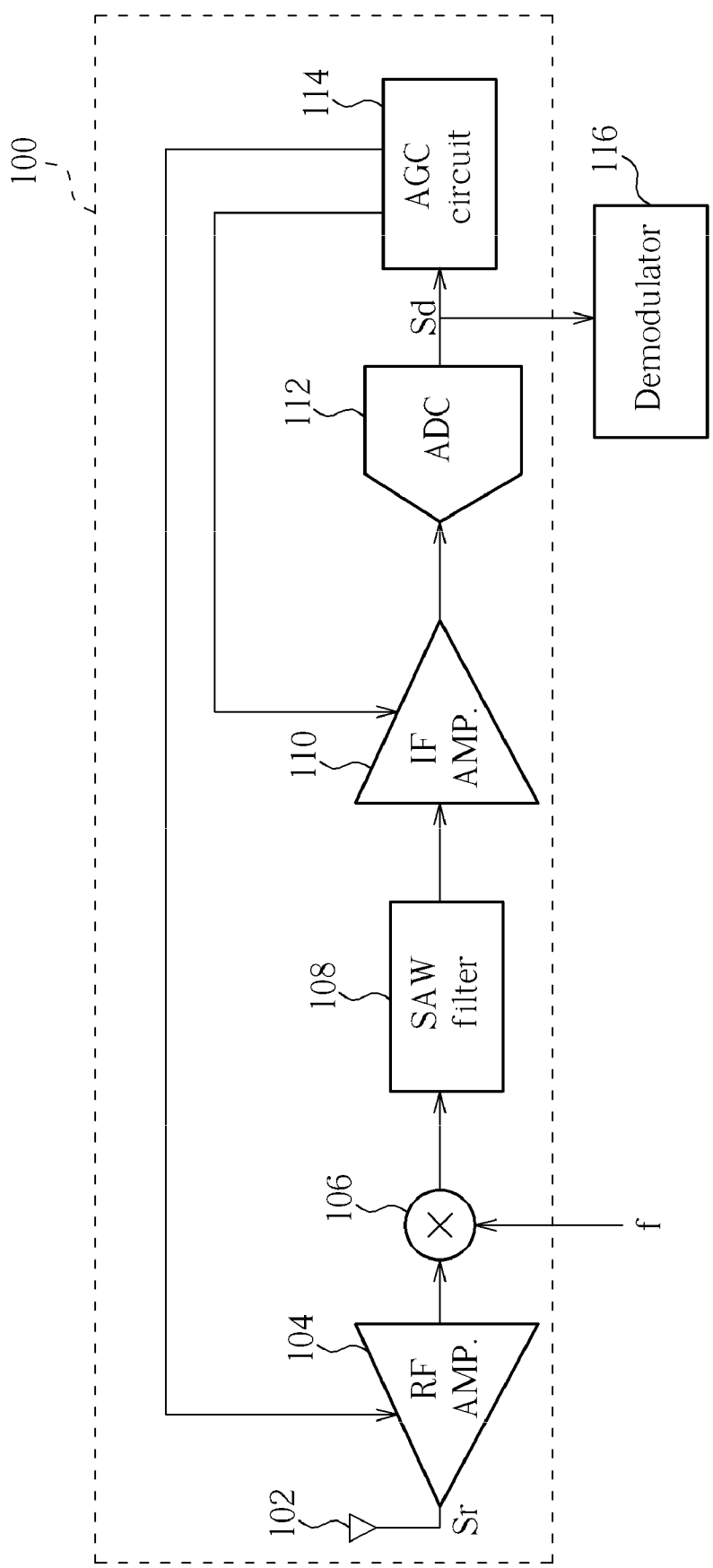
FIG. 1 is a diagram illustrating a conventional radio signal receiving module.
Figure 2:
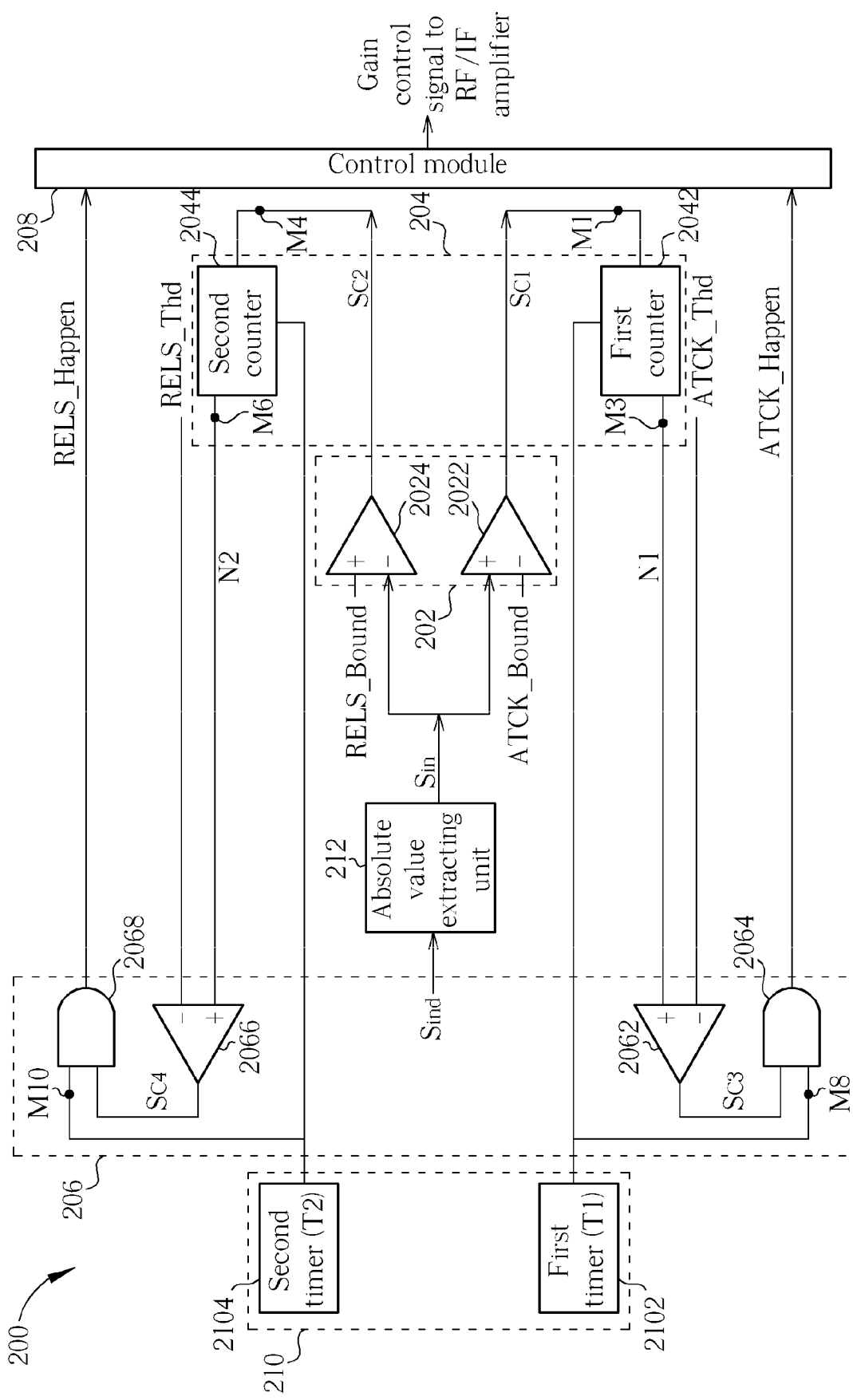
FIG. 2 is a diagram illustrating an AGC apparatus according to an embodiment of the present invention.

Please refer to FIG. 2. FIG. 2 is a diagram illustrating an AGC apparatus 200 according to an embodiment of the present invention. In this embodiment, a first operating device, which is a radio frequency amplifier, and a second operating device, which is an intermediate frequency amplifier, are included. The AGC apparatus 200 only adjusts the gain of the radio frequency amplifier or the intermediate frequency amplifier at a time. The AGC apparatus 200 comprises a first comparing module 202, a counting module 204, a second comparing module 206, a control module 208, and a timer module 210.

The first comparing module 202 compares an input signal Sin with a first threshold level ATCK_Bound and a second threshold level RELS_Bound to generate a first compared output signal Sc1 and a second compared output signal Sc2 respectively. The input signal Sin is digitized in this embodiment. The counting module 204 is coupled to the first comparing module 202 for performing a counting operation upon the first compared output signal Sc1 and the second compared output signal Sc2 to generate a first counting number N1 and a second counting number N2 respectively. The second comparing module 206 is coupled to the counting module 204 for comparing the first counting number N1 with a first threshold number ATCK_Thd to generate a first detection signal ATCK_Happen, and comparing the second counting number N2 with a second threshold number RELS_Thd to generate a second detection signal RELS_Happen. The control module 208 is coupled to the second comparing module 206, the first operating device and the second operating device for controlling the gain of the first operating device and the second operating device according to the first detection signal ATCK_Happen and the second detection signal RELS_Happen. In addition, the timer module 210 is coupled to the second comparing module 206 and the counting module 204 for counting a first predetermined period of time T1 and a second predetermined period of time T2, wherein the second comparing module 206 outputs the first detection signal ATCK_Happen and the first counting number N1 is reset, when the first predetermined period of time T1 counted by the timer module 210 expires, and the second comparing module 206 outputs the second detection signal RELS_Happen and the second counting number N2 is reset, when the second predetermined period of time T2 counted by the timer module 210 expires.

According to the embodiment of the present invention, the first comparing module 202 comprises a first comparator 2022 and a second comparator 2024. The first comparator 2022 compares the input signal Sin with the first threshold level ATCK_Bound for generating the first compared output signal Sc1. Similarly, the second comparator 2024 compares the input signal Sin with the second threshold level RELS_Bound for generating the second compared output signal Sc2. The timer module 210 comprises a first timer 2102 and a second timer 2104. The first timer 2102 counts the first predetermined period of time T1 and the second timer 2104 counts the second predetermined period of time T2. The counting module 204 comprises a first counter 2042 and a second counter 2044. The first counter 2042 comprises a first input terminal M1 to receive the first compared output signal Sc1, and an output terminal M3 to output the first counting number N1. Similarly, the second counter 2044 comprises a first input terminal M4 to receive the second compared output signal Sc2, and an output terminal M6 to output the second counting number N2. Further, the first counter 2042 and the second counter 2044 act on counting or resetting according to the first timer 2102 and the second timer 2104 respectively.

Furthermore, the second comparing module 206 comprises a third comparator 2062, a first NAND gate 2064, a fourth comparator 2066, and a second NAND gate 2068. The third comparator 2062 compares the first counting number N1 with the first threshold number ATCK_Thd for generating a third compared output signal Sc3 to the first NAND gate 2064. The first NAND gate 2064 further generates the second detection signal RELS_Happen according to the first timer 2102 and the third compared output signal Sc3. Similarly, the fourth comparator 2066 compares the second counting number N2 with the second threshold number RELS_Thd for generating a fourth compared output signal Sc4 to the second NAND gate 2068. The second NAND gate 2068 generates the first detection signal ATCK_Happen according to the second timer 2104 and the fourth compared output signal Sc4.

Please note that, according to the embodiment of the present invention, the AGC apparatus 200 further comprises an absolute value extracting unit 212 coupled to the first comparing module 202. In this specification, the term "unit" is used to denote a circuit, a piece of program, or their combination. The absolute value extracting unit 212 is utilized for extracting the magnitude of a signed digital signal Sind and generating the input signal Sin with positive amplitude level, in which the absolute value extracting unit 212 comprises an input terminal for receiving the signed digital signal Sind, and an output terminal for outputting the input signal Sin to the first comparing module 202.

Furthermore, in this embodiment, the signed digital signal Sind is an amplitude modulation (AM) signal. Therefore, when the AGC apparatus 200 receives the input signed digital Sind, the first timer 2102 starts the first counter 2042 and to count the first predetermined period of time T1. In the first predetermined period of time T1, if the magnitude of the input signal Sin is higher than the first threshold level ATCK_Bound, the first comparator 2022 outputs the first compared output signal Sc1 to the first counter 2042. Then, the first counter 2042 counts the occurrence of the first compared output signal Sc1. That is, each time the first comparator 2022 outputs the first compared output signal Sc1, the first counter 2042 increases the first counting number N1 by one. Meanwhile, the third comparator 2062 compares the first counting number N1 with the first threshold number ATCK_Thd. Once the first counting number N1 is larger than the first threshold number ATCK_Thd in the first predetermined period of time T1, the third comparator 2062 outputs the third compared output signal Sc3 to the first NAND gate 2064. In other words, the third compared output signal Sc3 is a high level signal in this embodiment. When the first predetermined period of time T1 is time up, the first timer 2102 sends a high level signal to the first NAND gate 2064 and the first counter 2042 so as to output the first detection signal ATCK_Happen and reset the first counter 2042 for the next first predetermined period of time T1 respectively. In more detail, if both the voltage levels from the first timer 2102 and the third comparator 2062 are in high voltage level, the first NAND gate 2064 outputs the first detection signal ATCK_Happen to the control module 208 to decrease, which is the so called attack, the gain of the first/second operating device.

Similarly, when the AGC apparatus 200 receives the signed digital signal Sind, the second timer 2104 starts the second counter 2044 and to count the second predetermined period of time T2. In the second predetermined period of time T2, if the magnitude of the input signal Sin is smaller than the second threshold level RELS_Bound, the second comparator 2024 outputs the second compared output signal Sc2 to the second counter 2044. Then, the second counter 2044 counts the occurrence of the second compared output signal Sc2. That is, each time the second comparator 2024 outputs the second compared output signal Sc2, the second counter 2044 increases the second counting number N2 by one. Meanwhile, the fourth comparator 2066 compares the second counting number N2 with the second threshold number RELS_Thd. Once the second counting number N2 is larger than the second threshold number RELS_Thd in the second predetermined period of time T2, the fourth comparator 2066 outputs a fourth compared output signal Sc4 to the second NAND gate 2068. In other words, the fourth compared output signal Sc4 is a high level signal in this embodiment. When the second predetermined period of time T2 is time up, the second timer 2104 sends a high level signal to the second NAND gate 2068 and the second counter 2044 so as to output the second detection signal RELS_Happen and reset the second counter 2044 for the next second determined period of time T2 respectively. In more detail, if the both the voltage levels from the second timer 2104 and the fourth comparator 2066 are in high voltage level, the second NAND gate 2068 outputs the second detection signal RELS_Happen to the control module 208 to increase, which is the so called release, the gain of the first/second operating device.

Figure 3:
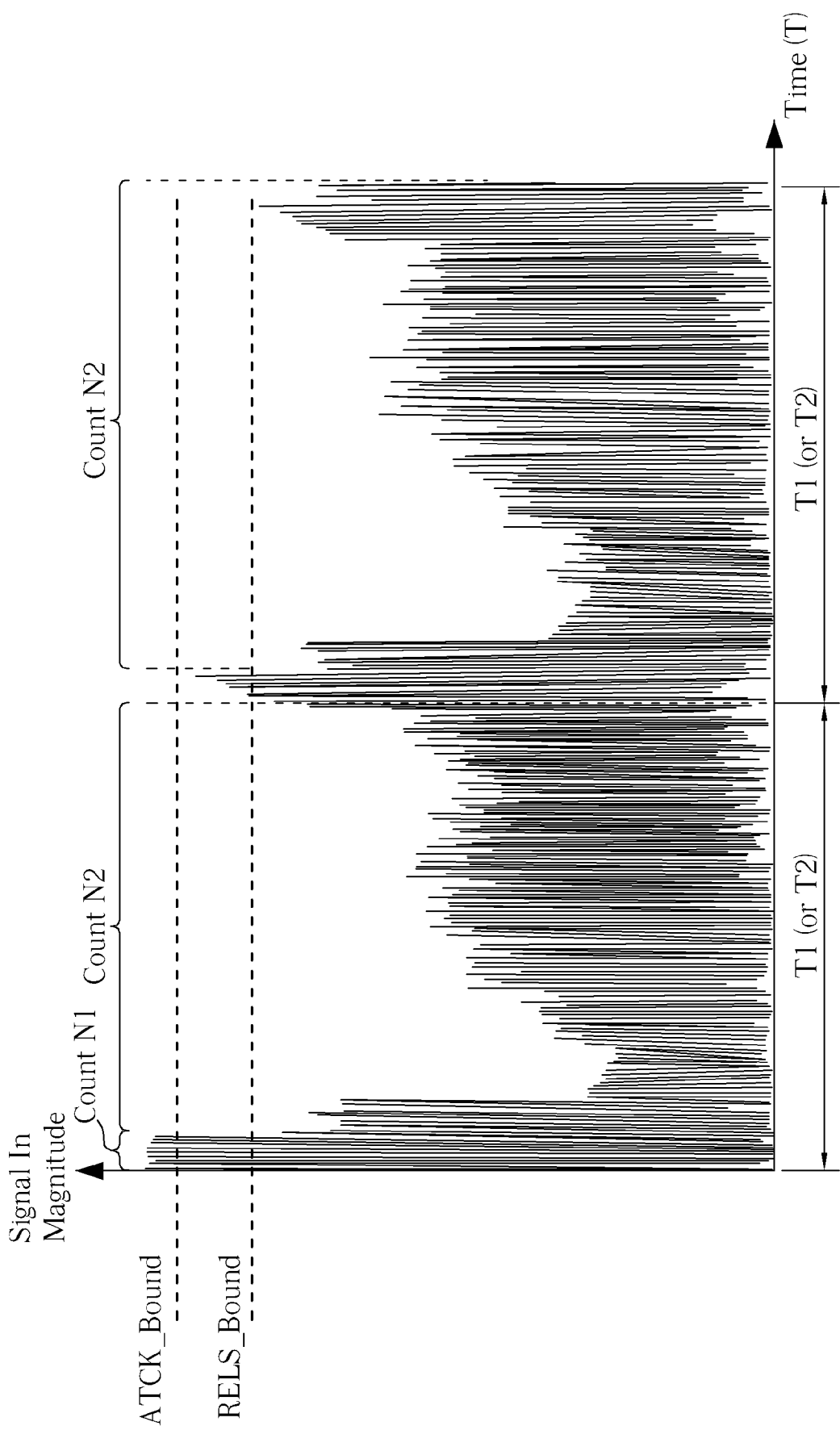
FIG. 3 is a timing diagram illustrating of the input signal as shown in FIG. 2.

Please note that, according to the embodiment of the present invention, the first threshold level ATCK_Bound is greater than the second threshold level RELS_Bound, and the first predetermined period of time T1 is not longer than the second predetermined period of time T2, but this is not meant to be a limitation of the present invention. Please refer to FIG. 3. FIG. 3 is a timing diagram illustrating of the input signal Sin as shown in FIG. 2, in which the X-axis represents the time T and the Y-axis represents the signal in magnitude. It can be viewed that, when the magnitude of the input signal Sin is higher than the first threshold level ATCK_Bound, the first counter 2042 counts the first compared output signal Sc1 for the first counting number N1; when the magnitude of the input signal Sin is smaller than the second threshold level RELS_Bound, the second counter 2044 counts the second compared output signal Sc2 for the second counting number N2.

Figure 4:
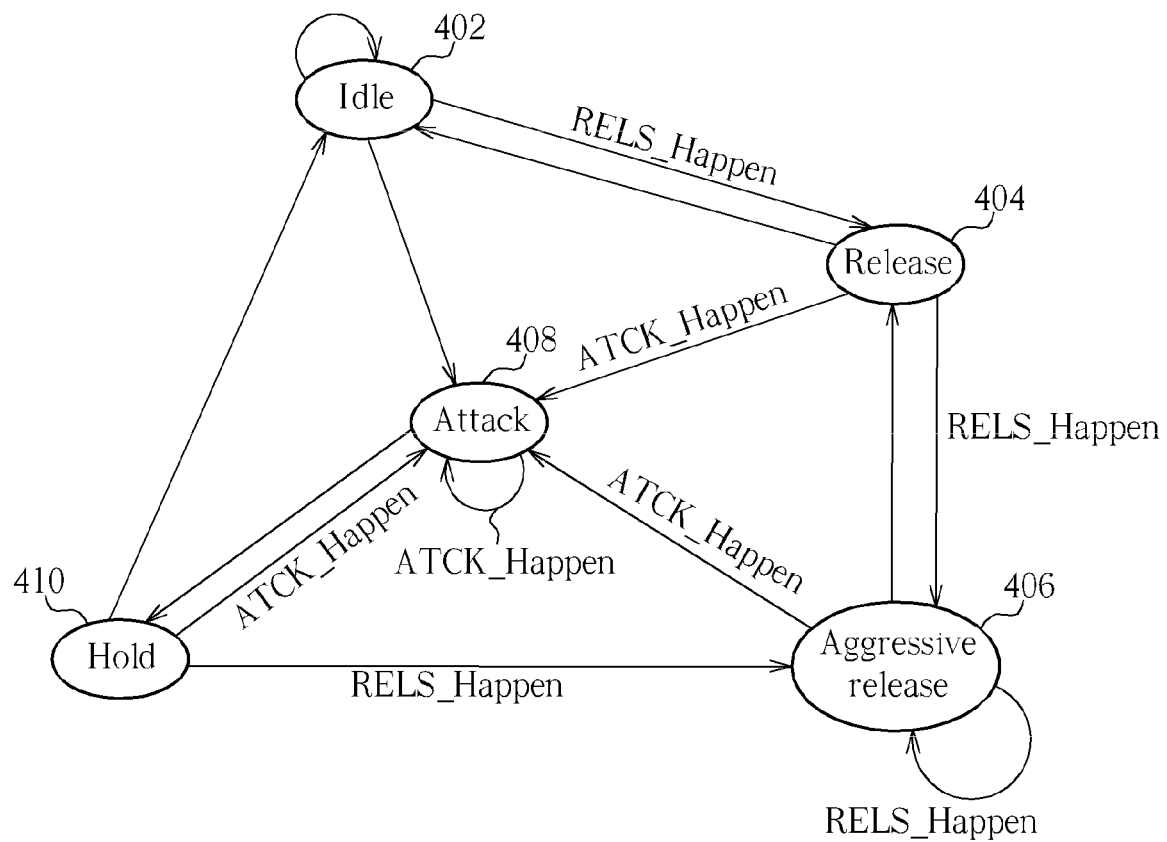
FIG. 4 is a state diagram of the control module in the AGC apparatus as shown in FIG. 2.

Please refer to FIG. 4. FIG. 4 is a state diagram of the control module 208 in the AGC apparatus 200 as shown in FIG. 2. The state diagram comprises five states, which are the states of idle 402, release 404, aggressive release 406, attack 408, and hold 410. Please note that, in order to describe the spirit of the state diagram of the control module 208 more clearly, the description related to FIG. 4 is illustrated by the controlling between the first operating device and the control module 208.

The control module 208 controls the first/second operating device to enter the state of release 404 from the state of idle 402 when the second detection signal RELS_Happen is asserted. In the state of release 404, the control module 208 controls the first/second operating device to enter the state of aggressive release 406 if the second detection signal RELS_Happen is asserted again, or the control module 208 controls the first/second operating device to enter the state of attack 408 if the first detection signal ATCK_Happen is asserted. The control module 208 controls the first/second operating device to go back to the state of idle 402 from the state of release 404 if the first detection signal ATCK_Happen and the second detection signal RELS_Happen are not asserted. In the state of the aggressive release 406, the control module 208 controls the first/second operating device to re-enter the state of aggressive release 406 if the second detection signal RELS_Happen is asserted again, or the control module 208 controls the first/second operating device to enter the state of attack 408 if the first detection signal ATCK_Happen is asserted. The control module 208 controls the first/second operating device to go back to the state of release 404 from the state of the aggressive release 406 if the first detection signal ATCK_Happen and the second detection signal RELS_Happen are not asserted.

The control module 208 controls the first/second operating device to enter the state of attack 408 from the state of idle 402 when the first detection signal ATCK_Happen is asserted. In the state of attack 408, the control module 208 controls the first/second operating device to re-enter the state of attack 408 if the first detection signal ATCK_Happen is asserted again, or the control module 208 controls the first/second operating device to enter the state of hold 410 from the state of attack 408 if the first detection signal ATCK_Happen is not asserted. In the state of hold 410, the control module 208 controls the first/second operating device to go back to the state of attack 408 if the first detection signal ATCK_Happen is asserted, or enter the state of aggressive release 406 if the second detection signal RELS_Happen is asserted. The control module 208 controls the first/second operating device to enter the state of idle 402 from the state of hold 410 if the first detection signal ATCK_Happen and the second detection signal RELS_Happen are not asserted. In addition, the control module 208 controls the first/second operating device to re-enter the state of ideal 402 if the first detection signal ATCK_Happen and the second detection signal RELS_Happen are not asserted.

In another embodiment, the state diagram further comprises a state of aggressive attack. In the state of attack 408, the control module 208 controls the first/second operating device to enter the state of aggressive attack if the first detection signal ATCK_Happen is asserted again. In the state of the aggressive attack, the control module 208 controls the first/second operating device to re-enter the state of aggressive attack if the first detection signal ATCK_Happen is asserted again, or the control module 208 controls the first/second operating device to enter the state of attack 408 if the first detection signal ATCK_Happen is not asserted.

In more detail, when the first detection signal ATCK_Happen is first asserted, the control module 208 sends a control signal to decrease the gain of the first/second operating device by a first gain decrease rate, and when consecutive first detection signals are asserted, to decrease the gain of the first/second operating device by the first gain decrease rate (the state of attack 408). In another embodiment, when consecutive first detection signals are asserted, to decrease the gain of the first/second operating device by a second gain decrease rate (the state of aggressive attack), in which the second gain increase rate is greater than the first gain increase rate. Furthermore, when the second detection signals RELS_Happen is first asserted, the control module 208 sends the gain control signal to increase the gain of the first/second operating device by a first gain increase rate (the state of release 404), and when consecutive second detection signals are asserted, to increase the gain of the first/second operating device by a second gain increase rate (the state of aggressive release 406), in which the second gain increase rate is greater than the first gain increase rate.

Figure 5:
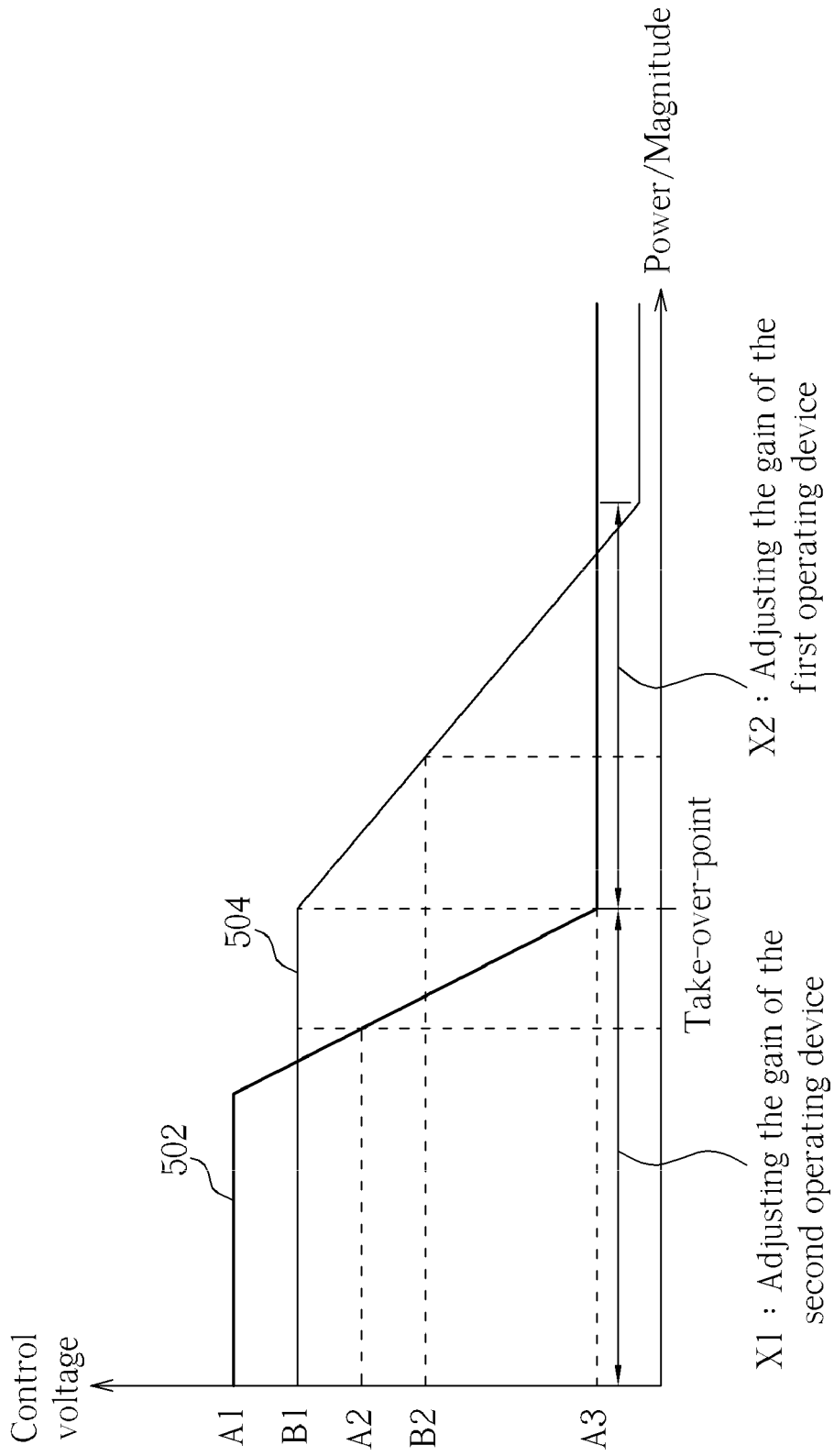
FIG. 5 is a diagram illustrating the take-over-point (TOP) between the first operating device and the second operating device controlled by the AGC apparatus of the present invention.

FIG. 5 is a diagram illustrating the take-over-point (TOP) between the first operating device and the second operating device controlled by the AGC apparatus 200 of the present invention, in which the X-axis represents the power/magnitude of the input signal Sin, and the Y-axis represents the control voltage. In more detail, the control mode 208 outputs control voltages for adjusting the gain of the first operating device and the second operating device. The curve 502 is the control voltage of the second operating device and the curve 504 is the control voltage of the first operating device. Since the first operating device and the second operating device are controlled by the same AGC apparatus 200, thus the operating range of the first operating device and the second operating device can be separated by take-over-point (TOP) clearly. In other words, the power/magnitude that is smaller than the take-over-point (TOP) is controlled by the second operating device, which is represented by the curve 502, and the power/amplitude that is larger than the take-over-point (TOP) is controlled by the first operating device, which is represented by the curve 504. For example, in the state X1, the AGC apparatus 200 sets the control voltage of the first operating device as a value B1 and the control voltage of the second operating device as a value A2. Then the AGC apparatus 200 adjusts the gain of the second operating device according to the first/second detection signal ATCK_Happen/RELS_Happen. That is, the AGC apparatus 200 varies the control voltage of the second operating device to adjust corresponding gain according to the first/second detection signal ATCK_Happen/RELS_Happen, and holds the control voltage of the first operating device as the value B1. In another embodiment of the present invention, in the state X2, the AGC apparatus may set the control voltage of the first operating device as a value B2 and the control voltage of the second operating device as a value A3. Then the AGC apparatus 200 adjusts the gain of the first operating device according to the first/second detection signal ATCK_Happen/RELS_Happen.

Figure 6:
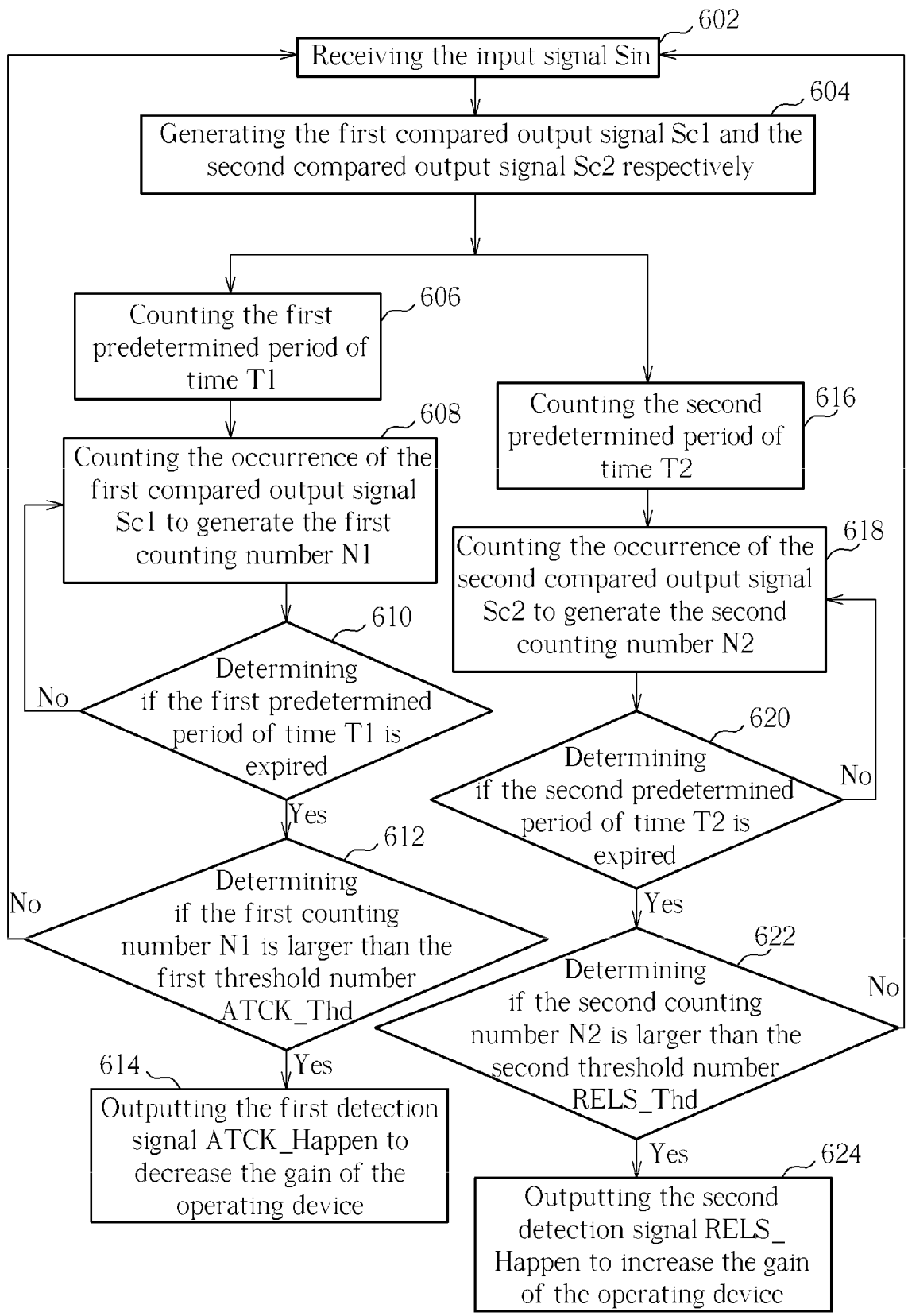
FIG. 6 is a flowchart illustrating a gain control method according to an embodiment of the present invention.

Please refer to FIG. 6. FIG. 6 is a flowchart illustrating a gain control method 600 according to an embodiment of the present invention. The disclosure of the gain control method 600 is described in conjunction with the AGC apparatus 200 as shown in FIG. 2. Provided that substantially the same result is achieved, the steps of the flowchart shown in FIG. 6 need not be in the exact order shown and need not be contiguous, that is, other steps can be intermediate. The gain control method 600 comprises the following steps:

Step 602: Receiving the input signal Sin;

Step 604: comparing the input signal Sin with the first threshold level ACTK_Bound and the second threshold level RELS_Bound to generate the first compared output signal Sc1 and the second compared output signal Sc2 respectively, go to step 606 and step 616;

Step 606: counting the first predetermined period of time T1;

Step 608: counting the occurrence of the first compared output signal Sc1 to generate the first counting number N1;

Step 610: determining if the first predetermined period of time T1 is expired; if yes, go to step 612, if no, go to step 608;

Step 612: determining if the first counting number N1 is larger than the first threshold number ATCK_Thd; if yes go to step 614, if no go to step 602;

Step 614: outputting the first detection signal ATCK_Happen to decrease the gain of the operating device;

Step 616: counting the second predetermined period of time T2;

Step 618: counting the occurrence of the second compared output signal Sc2 to generate the second counting number N2;

Step 620: determining if the second predetermined period of time T2 is expired; if yes, go to step 622, if no, go to step 618;

Step 622: determining if the second counting number N2 is larger than the second threshold number RELS_Thd; if yes go to step 624, if no go to step 602;

Step 624: outputting the second detection signal RELS_Happen to increase the gain of the operating device.

Please note that, the steps 602~624 of the gain control method 600 can be implemented by the elements of the AGC apparatus 200 as shown in FIG. 2, and the operation of the AGC apparatus 200 was clearly described in above paragraph, and those skilled in this art will readily understand the operation of the gain control method 600 after reading the above mentioned disclosure, thus the detail is omitted here for brevity.

In conclusion, the AGC apparatus 200 of the present invention is mainly comprised of comparators and counters, which greatly reduces the size of the AGC apparatus 200. Furthermore, since the first operating device and the second operating device are controlled by the same AGC apparatus 200, thus the operating range of the first operating device and the second operating device can be separated clearly.

Those skilled in the art will readily observe that numerous modifications and alterations of the device and method may be made while retaining the teachings of the invention.

What is claimed is:

1. An automatic gain control apparatus for controlling a radio frequency amplifier and an intermediate frequency amplifier, comprising:
   a first comparing module, for comparing an input signal with a first threshold level and a second threshold level to generate a first compared output signal and a second compared output signal respectively;
   a counting module, coupled to the first comparing module, for performing a first counting operation upon the first compared output signal to generate a first counting number, and performing a second counting operation upon the second compared output signal to generate a second counting number;
   a second comparing module, coupled to the counting module, for comparing the first counting number with a first threshold number to generate a first detection signal, and comparing the second counting number with a second threshold number to generate a second detection signal; and
   a control module, coupled to the second comparing module, the radio frequency amplifier and intermediate frequency amplifier, for controlling the gain of the radio frequency amplifier or the intermediate frequency amplifier according to the first detection signal and the second detection signal.

2. The automatic gain control apparatus of claim 1, wherein the first threshold level is greater than the second threshold level, the first detection signal is utilized to decrease the gain of the radio frequency amplifier or the intermediate frequency amplifier, and the second detection signal is utilized to increase the gain of the radio frequency amplifier or intermediate frequency amplifier.

3. The automatic gain control apparatus of claim 2, further comprising:
   a timer module, coupled to the second comparing module, for counting a first predetermined period of time and a second predetermined period of time;
wherein the second comparing module outputs the first detection signal and the first counting number is reset each time when the first predetermined period of time counted by the timer module expires; and outputs the second detection signal and the second counting number is reset each time when the second predetermined period of time counted by the timer module expires.

4. The automatic gain control apparatus of claim 3, wherein the first predetermined period of time is not longer than the second predetermined period of time.

5. The automatic gain control apparatus of claim 4, wherein when the first detection signal is first asserted, the control module sends a gain control signal to decrease the gain of the radio frequency amplifier or the intermediate frequency amplifier by a first gain decrease rate, and when consecutive first detection signals are asserted, the control module sends the gain control signal to decrease the gain of the radio frequency amplifier or the intermediate frequency amplifier by a second gain decrease rate, in which the second gain decrease rate is greater than the first gain decrease rate.

6. The automatic gain control apparatus of claim 4, wherein when the second detection signal is first asserted, the control module sends a gain control signal to increase the gain of the radio frequency amplifier or the intermediate frequency amplifier by a first gain increase rate, and when consecutive second detection signals are asserted, to increase the gain of the radio frequency amplifier or the intermediate frequency amplifier by a second gain increase rate, in which the second gain increase rate is greater than the first gain increase rate.

7. The automatic gain control apparatus of claim 1, further comprising:
an absolute value extracting unit, coupled to the first comparing model, for receiving a signed digital signal and generating the input signal with positive amplitude level.

8. An automatic gain control method for controlling a radio frequency amplifier and an intermediate frequency amplifier, comprising:
(a) comparing an input signal with a first threshold level and a second threshold level to generate a first compared output signal and a second compared output signal respectively;
(b) performing a first counting operation upon the first compared output signal to generate a first counting number and a second counting operation upon the second compared output signal to generate a second counting number;
(c) comparing the first counting number with a first threshold number to generate a first detection signal and the second counting number with a second threshold number to generate a second detection signal; and
(d) controlling the gain of the radio frequency amplifier or the intermediate frequency amplifier according to the first detection signal and the second detection signal.

9. The automatic gain control method of claim 8, wherein the first threshold level is greater than the second threshold level, the first detection signal is utilized to decrease the gain of the radio frequency amplifier or the intermediate frequency amplifier, and the second detection signal is utilized to increase the gain of the radio frequency amplifier or the intermediate frequency amplifier.

10. The automatic gain control method of claim 9, further comprising:
counting a first predetermined period of time and a second predetermined period of time;
wherein the first counting number is reset each time when the first predetermined period of time expires; and the second counting number is reset each time when the second predetermined period of time counted by the timer module expires.

11. The automatic gain control method of claim 10, wherein the first predetermined period of time is not longer than the second predetermined period of time.

12. The automatic gain control method of claim 11, wherein when the first detection signal is first asserted, decreases the gain of the radio frequency amplifier or the intermediate frequency amplifier by a first gain decrease rate, and when consecutive first detection signals are asserted, decreases the gain of the radio frequency amplifier or the intermediate frequency amplifier by a second gain decrease rate, in which the second gain decrease rate is greater than the first gain decrease rate.

13. The automatic gain control method of claim 11, wherein when the second detection signal is first asserted, increases the gain of the radio frequency amplifier or the intermediate frequency amplifier by a first gain increase rate, and when consecutive second detection signals are asserted, increases the gain of the radio frequency amplifier or the intermediate frequency amplifier by a second gain increase rate, in which the second gain increase rate is greater than the first gain increase rate.

* * * * *